(12) United States Patent
Chen et al.

(10) Patent No.: US 8,543,883 B2
(45) Date of Patent: *Sep. 24, 2013

(54) DECODING LOW-DENSITY PARITY CHECK (LDPC) CODEWORDS

(75) Inventors: Qifan Chen, Shanghai (CN); Ning Zhang, Saratoga, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/607,609

(22) Filed: Sep. 7, 2012

(65) Prior Publication Data

US 2013/0007554 A1   Jan. 3, 2013

Related U.S. Application Data

(63) Continuation of application No. 12/346,043, filed on Dec. 30, 2008, now Pat. No. 8,286,048.

(51) Int. Cl.
   *H03M 13/00* (2006.01)
(52) U.S. Cl.
   USPC .......................................................... 714/752
(58) Field of Classification Search
   None
   See application file for complete search history.

(56) References Cited

U.S. PATENT DOCUMENTS

| | | | |
|---|---|---|---|
| 4,325,085 A * | 4/1982 | Gooch | 382/234 |
| 7,343,548 B2 | 3/2008 | Blankenship et al. | |
| 7,770,090 B1 * | 8/2010 | Kons et al. | 714/780 |
| 7,876,860 B1 | 1/2011 | Varnica et al. | |
| 8,099,645 B2 | 1/2012 | Djordjevic et al. | |
| 8,151,161 B2 * | 4/2012 | Cho et al. | 714/752 |
| 8,190,962 B1 | 5/2012 | Chen | |
| 8,266,493 B1 * | 9/2012 | Abbaszadeh et al. | 714/752 |
| 8,286,048 B1 | 10/2012 | Chen | |
| 2004/0148561 A1 | 7/2004 | Shen et al. | |
| 2005/0204272 A1 | 9/2005 | Yamagishi | |
| 2006/0129904 A1 * | 6/2006 | Blankenship et al. | 714/800 |
| 2006/0150010 A1 * | 7/2006 | Stiffler et al. | 714/13 |
| 2006/0195765 A1 | 8/2006 | Coffey | |
| 2006/0218459 A1 * | 9/2006 | Hedberg | 714/752 |
| 2007/0127589 A1 | 6/2007 | Hwang et al. | |
| 2007/0260959 A1 | 11/2007 | Sidi et al. | |
| 2008/0148133 A1 * | 6/2008 | Duggan | 714/796 |

(Continued)

OTHER PUBLICATIONS

Studer et al., "Configurable High-Throughput Decoder Architecture for Quasi-Cyclic LDPC Codes", Oct. 26-29, 2008, IEEE.*

(Continued)

*Primary Examiner* — Gabriel Chu
(74) *Attorney, Agent, or Firm* — Bever, Hoffman & Harms, LLP

(57) ABSTRACT

A low-density parity-check (LDPC) codeword is decoded by performing a partial parity check, and based on the partial parity check, determining whether an iteration condition is met. Determining whether the iteration condition is met includes determining whether a time to decode a last codeword is approaching. Determining whether the iteration condition is met can additionally include determining whether a number of partial iterations reaches a maximum number of iterations and/or determining whether hardware resources are becoming limited. If the iteration condition is met, a decoding result is reported. If the iteration condition is not met, then a plurality of check nodes are updated and a parity check is performed.

18 Claims, 8 Drawing Sheets

(56) References Cited

U.S. PATENT DOCUMENTS

| | | |
|---|---|---|
| 2008/0250300 A1 | 10/2008 | Mokhlesi et al. |
| 2008/0294970 A1 | 11/2008 | Gross et al. |
| 2009/0063926 A1 | 3/2009 | Cho et al. |
| 2009/0196380 A1 | 8/2009 | Anekoji |
| 2009/0259912 A1 | 10/2009 | Djordjevic et al. |
| 2010/0031118 A1 | 2/2010 | Blanksby et al. |
| 2010/0031119 A1 | 2/2010 | Lin et al. |
| 2010/0146360 A1 | 6/2010 | Trofimenko et al. |
| 2011/0055655 A1 | 3/2011 | Hocevar |

OTHER PUBLICATIONS

Andrews, Kenneth S. et al., "The Development of Turbo and LDPC Codes for Deep-Space Applications", IEEE, Proceedings of the IEEE, vol. 95, No. 11, Nov. 2007, pp. 2142-2156.

Leiner, Bernhard M. J.,"LDPC Codes—a brief Tutorial", Apr. 8, 2005, 9 pages, [http://bernh.net/media/download/papers/ldpc.pdf].

Pusane, Ali Emre et al., "Implementation Aspects of LDPC Convolution Codes", IEEE Transactions on Communications, vol. 56, No. 7, Jul. 2008, pp. 1060-1069.

\* cited by examiner ns systems.
DECODING LOW-DENSITY PARITY CHECK (LDPC) CODEWORDS

CROSS REFERENCE TO RELATED APPLICATION

This application is a continuation of U.S. patent application Ser. No. 12/346,043, filed on Dec. 30, 2008, entitled "DYNAMICALLY SCALED LLR FOR AN LDPC DECODER" which is related to commonly assigned, application Ser. No. 12/346,021, filed on Dec. 30, 2008, now U.S. Pat. No. 8,190,962, entitled "SYSTEM AND METHOD FOR DYNAMIC MAXIMAL ITERATION", by Qifan Chen, et al.

FIELD OF THE INVENTION

The present invention is generally related to ECC communications systems.

BACKGROUND

Many different types of information transmission systems utilize error correction techniques to improve their efficiency. This is particularly true for those systems that need to reliably function across inherently noisy communications channels. Examples include wired systems for transmitting and receiving across noise prone physical communications lines (e.g., cable modems, DSL modems, and the like) and wireless systems for transmitting and receiving wirelessly via RF (e.g., wireless modems, wireless access points, wireless routers, and the like). Each of the above examples use an error correction system to improve efficiency.

An error correction system has the ability to both detect the presence of errors caused by noise or other impairments during transmission of data from a transmitter to a receiver, and the ability to reconstruct the original, error-free data. Generally, the system functions by the transmitter encoding the data with an error-correcting code (ECC) and sending the resulting coded message to the receiver. The receiver decodes what it receives into the data that was "most likely" transmitted by the transmitter. The codes are designed so that it would take an "unreasonable" amount of noise to trick the receiver into misinterpreting the data.

One of the more widely used ECC techniques is the low-density parity check code. A low-density parity-check code (LDPC code) is an error correcting code that increases the efficiency of transmitting data over a noisy channel. Although LDPC and other error correcting codes cannot guarantee perfect reconstruction of a transmitted signal, the probability of lost information can be made very small. LDPC was the first code to allow data transmission rates close to the theoretical maximum, and remains, one of the most effective ECC's developed to date. The explosive growth in information technology has produced a corresponding increase of commercial interest in the development of systems that implement the highly efficient LDPC codes. For example, an LDPC code system was selected to become the error correcting code in the new DVB-S2 standard for the satellite transmission of digital television.

The performance of an LDPC based transmission and reception system depends upon the performance of its LDPC encoder (e.g., within the transmitter) and its LDPC decoder (e.g., within the receiver). In particular, efficient overall system performance is more heavily affected by the performance of the LDPC decoder. As LDPC codes are being considered for use in a wide range of applications, the search for efficient implementations of decoding algorithms is being pursued intensively.

One of the more widely used LDPC decoding algorithms is the Belief Propagation algorithm. The belief propagation algorithm generally delivers good decoding performance. However, the belief propagation algorithm is problematic in that it can be computationally demanding. This property makes belief propagation algorithms difficult to efficiently implement in hardware. This has led to the development of a number of reduced-complexity variants of the BP algorithm that attempt to deliver satisfactory LDPC decoding performance while staying within a smaller power envelope (e.g., handheld devices, laptop computers, battery-powered components, etc.) or within a smaller hardware envelope (e.g., reduced cost, reduced transistor count, etc.).

Accordingly, a problem exists in that the numerous reduced-complexity variants of the BP algorithm involve compromises in their ability to deliver near-optimum decoding performance. For example, a low-power variant of the BP algorithm typically cannot provide enough throughput to satisfy more demanding applications. Similarly, a high-performance variant typically cannot be produced at a sufficiently low cost level to satisfy many mass-market applications.

Thus, there exists a great interest in the further optimization of BP algorithm LDPC decoder implementations.

SUMMARY

Embodiments of the claimed subject matter provide a solution that optimizes the performance of a BP (belief propagation) algorithm when used to instantiate an LDPC decoder. Embodiments of the claimed subject matter can further provide high throughput to satisfy demanding communications applications and, with regard to complexity, can be efficiently produced to satisfy many mass-market applications.

In one embodiment, a receiver is implemented that performs a method for decoding LDPC (low-density parity check) code words. The method includes receiving a plurality of LLR (log likelihood ratio) terms from a demodulation unit of the receiver. A scaling factor is then generated in accordance with at least one parameter descriptive of communication channel conditions for the receiver. The scaling factor is applied to each of the plurality of LLR terms to compute a corresponding plurality of scaled LLR terms. An iterative layered belief propagation algorithm is then executed by using the plurality of scaled LLR terms as inputs. Execution of the iterative layered belief propagation algorithm generates the resulting decoded information.

In one embodiment, the parameter descriptive of the communication channel conditions is a signal to noise ratio (SNR) parameter. The scaling factor is adjusted in accordance with the information provided by the signal to noise ratio parameter. Similarly, in one embodiment, the parameter is a modulation coding scheme (MCS) parameter, where the scaling factor is adjusted in accordance with the particular modulation coding scheme in use at the particular time. Alternatively, a plurality of parameters (e.g., the signal to noise ratio parameter, the modulation coding scheme parameter, etc.) can be used to dynamically adjust the scaling factor.

In one embodiment, a receiver is implemented that includes a system for decoding an LDPC (low-density parity check) code word, having a demodulation unit, a scaling unit, and an LDPC decoder unit. The demodulation unit is for generating a plurality of LLR (log likelihood ratio) terms. The scaling unit is coupled to receive the plurality of LLR terms from the demodulation unit, and is configured to generate a scaling factor in accordance with at least one parameter descriptive of communication channel conditions of the receiver. The scaling unit is further configured to apply the scaling factor to each of the LLR terms to compute a corresponding plurality of scaled LLR terms. The LDPC decoder unit is coupled to receive the scaled LLR terms from the scaling unit, and is configured to execute an iterative layered belief propagation algorithm using the plurality of scaled LLR terms as inputs. The execution of the iterative layered belief propagation algorithm results in the decoded the LDPC codeword.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Figure 1:
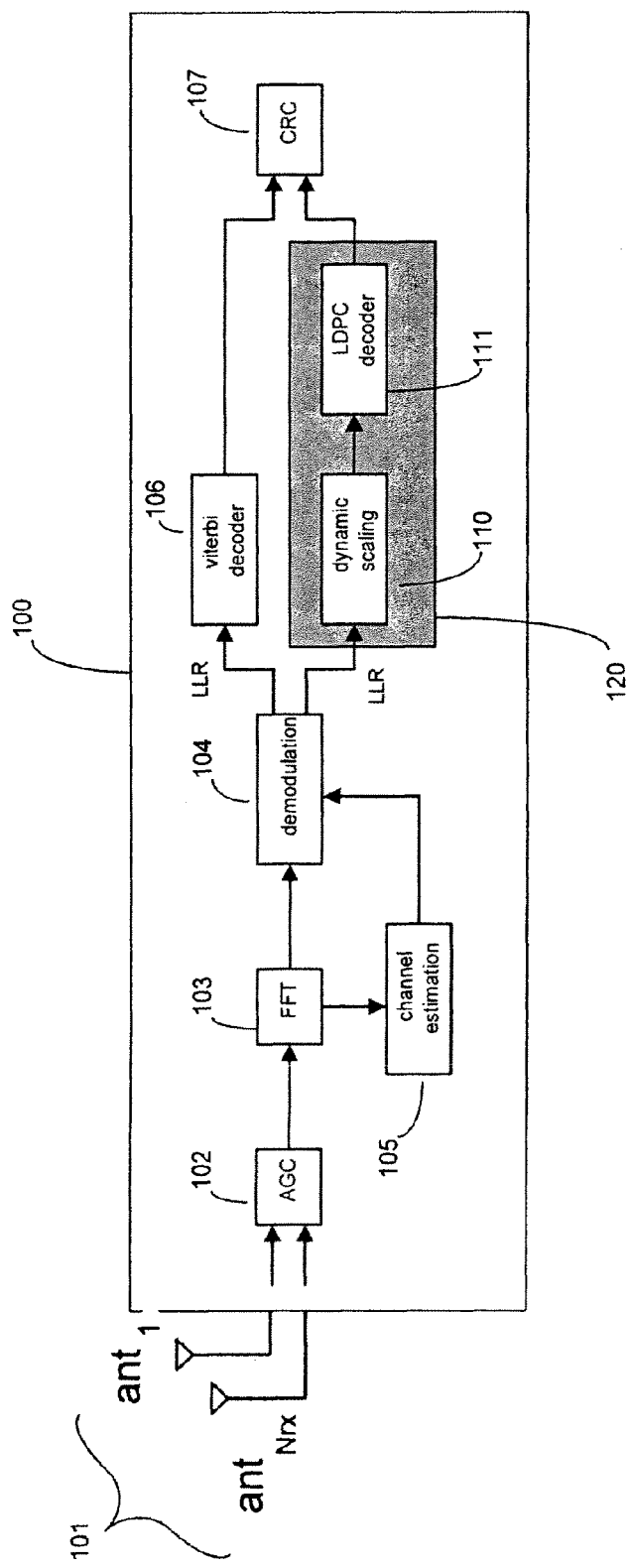
FIG. 1 shows an overview diagram of a receiver in accordance with one embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Notation and Nomenclature:

Some portions of the detailed descriptions which follow are presented in terms of procedures, steps, logic blocks, processes, and other symbolic representations of operations on data bits within a computer readable memory, or processes that, in various embodiments, are carried out by a processor under the control of computer-readable and computer-executable instructions. Embodiments of the present invention may thus be stored as computer readable media or computer-executable instructions including, but not limited to, a firmware update, software update package, or hardware (e.g., ROM). These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "indexing" or "executing" or "storing" or "decoding" or the like, refer to the action and processes of a computer system, embedded computer system, or similar electronic computing device, that manipulates and transforms data represented as physical (electronic) quantities within the computer system's registers and memories into other data similarly represented as physical quantities within the computer system memories or registers or other such information storage, transmission or display devices.

Dynamic Scaling Factor Embodiments of the Invention:

Dynamic scaling factor embodiments of the present invention provide a solution that optimizes the performance of a BP (belief propagation) algorithm when used to instantiate an LDPC decoder. The dynamic scaling factor embodiments of the present invention can further provide high throughput to satisfy demanding communications applications and can be efficiently produced to satisfy many mass-market applications. In one embodiment, a receiver (e.g., receiver 100 of FIG. 1) is implemented that performs a method for decoding an LDPC (low-density parity check) code words. The method includes receiving a plurality of LLR (log likelihood ratio) terms from a demodulation unit of the receiver. A scaling factor is then generated in accordance with at least one parameter descriptive of communication channel conditions for the receiver. The scaling factor is applied to each of the plurality of LLR terms to compute a corresponding plurality of scaled LLR terms. An iterative layered belief propagation algorithm is then executed by using the plurality of scaled LLR terms as inputs. Execution of the iterative layered belief propagation algorithm generates the resulting decoded information. Embodiments the present invention and their benefits are further described below.

FIG. 1 shows an overview diagram of a receiver 100 in accordance with one embodiment of the present invention. As depicted in FIG. 1, receiver 100 includes components used for the reception and decoding of LDPC code words in accordance with embodiments of the present invention.

As shown in FIG. 1 embodiment, the receiver 100 includes a plurality of RF reception antennas 101. These are shown as the antenna$_1$ through the antenna$_{Nrx}$, which are used to implement a communications channel across which the modulated LDPC code words are received. In one embodiment, the multiple antennas 101 are used to implement a MIMO (Multiple Input Multiple Output) based communications channel, where multiple data streams are received in parallel. The signals received by the antennas 101 are coupled to an AGC (automatic gain control) unit 102 where their respective signal levels are gain adjusted to suit the input requirements of the subsequent FFT unit 103.

Although the receiver 100 is shown as having the multiple antennas 101 for RF reception and is described in the context of OFDM reception and demodulation, it should be appreciated that the receiver 100 may be operable to implement a variety of communication protocols, formats, or standards including, but not limited to RF wireless, wired or wireless orthogonal frequency-division multiplexing (OFDM), 802.11n, 10GBase-T Ethernet (802.3an), WiMAX (IEEE 802.16e), DVB-S2 (Digital video broadcasting).

The FFT (Fast Fourier Transform) unit 103 functions by processing the signal information received from the AGO unit 102 and transforming the signal information from the time domain to the frequency domain. This information is then transmitted to a demodulation unit 104. The demodulation unit 104 functions by determining the most likely stream of OFDM symbols that correlates to the frequency domain information received from the FFT unit 103. The demodulation unit 104 thus generates a stream of LLR (log likelihood ratio) terms that most closely correlate to the signal information received from the FFT unit 103.

This stream of LLR terms is then provided to a signal processing unit 120, which includes both a dynamic scaling unit 110 and an LDPC decoder unit 111, as shown. The stream of LLR terms (e.g., the plurality of LLR terms) is received by a dynamic scaling unit 110. The dynamic scaling unit 110 is configured to generate a dynamic scaling factor in accordance with one or more parameters that describe certain characteristics of the communication channel conditions of the receiver 100. The dynamic scaling factor is applied to each of the plurality of LLR terms to compute a corresponding plurality of scaled LLR terms. Consequently, the output of the dynamic scaling unit 110 is a stream of scaled LLR terms (e.g., a plurality of scaled LLR terms).

The scaled LLR terms are then used as inputs by an LDPC decoder unit 111. The LDPC decoder unit 111 is configured to execute an iterative layered belief propagation algorithm using the plurality of scaled LLR terms as inputs. The execution of the iterative layered belief propagation algorithm results in the decoded the LDPC codeword, which is an output for final quality control check by the CRC (cyclic redundancy check) unit 107.

It should be noted that the dynamic scaling unit 110 advantageously adjusts the dynamic scaling factor to account for changing conditions of the communications channel of the receiver 100. For example, depending upon parameters such as signal to noise ratio (SNR), modulation coding scheme (MCS), channel flatness or the like, the dynamic scaling factor can be adjusted to optimize the throughput of the receiver 100 in view of the current communications channel conditions.

In this manner, the dynamically adjusted scaling factor provides a solution that optimizes the performance of layered belief propagation algorithm as executed by the LDPC decoder 111. The advantageous adjustments implemented by the adjustable scaling factor can enable the LDPC decoder 111 to provide both comparatively high throughput (e.g., bandwidth) and comparatively efficient decoder hardware (e.g., low transistor count, low hardware costs and low power consumption).

In the FIG. 1 embodiment, channel condition information, such as the signal to noise ratio parameter, can be produced by a channel estimation unit 105. As shown in FIG. 1, the channel estimation unit 105 is coupled to receive signal information from the FFT unit 103. This signal information allows the channel estimation unit 105 to assess the state of the current communication channel conditions. For example, using the information received from the FFT unit 103, the channel estimation unit 105 can derive an instant signal to noise ratio of the communications channel. This parameter information can also be provided to the demodulation unit 104 as shown, to aid in the generation of the LLR terms.

The FIG. 1 embodiment also shows the LLR stream produced by the demodulation unit 104 being coupled to both the dynamic scaling unit 110 in Digital Signal Processor (DSP) 120 and a viterbi decoder unit 106. The viterbi decoder unit 106 may be used to decode received signals encoded with a convolutional-type ECC whereas the DSP 120 may be used to decode received signals encoded with an LDPC-type ECC. In one embodiment, the DSP 120 may be selected when noise within the communication channel is relatively severe because LDPC-type ECC may be relatively more powerful than convolutional code with respect to error correction capability. The output of the dynamic scaling unit 110 is coupled to an LDPC decoder 111 which in turn is coupled to a CRC unit 107 for a final check. The output of the viterbi decoder unit 106 is similarly passed to the CRC unit 107.

Figure 2:
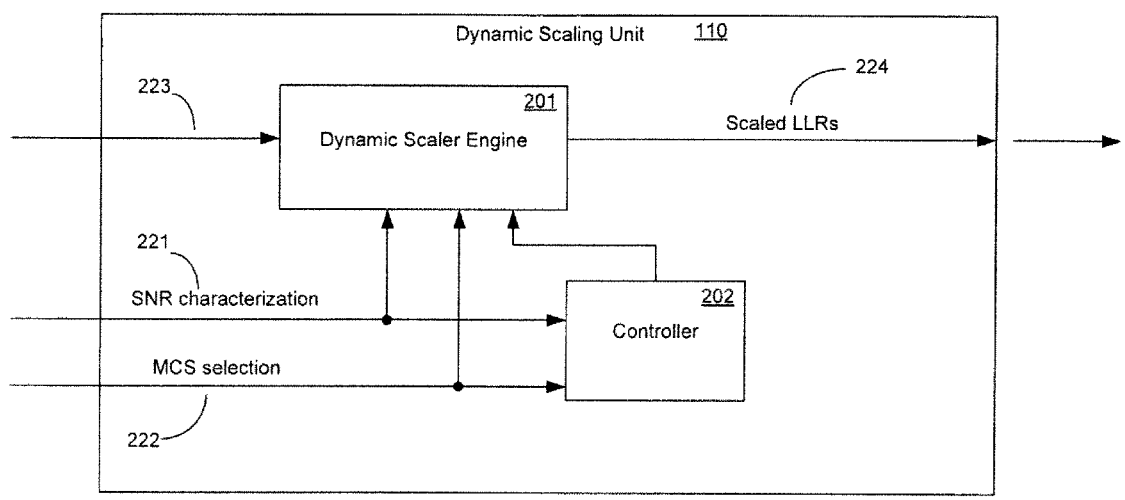
FIG. 2 shows a diagram of internal components that implement the functionality of the dynamic scaling unit in accordance with one embodiment of the present invention.

FIG. 2 shows a diagram of internal components that implement the functionality of the dynamic scaling unit 110 in accordance with one embodiment of the present invention. As depicted in FIG. 2, the dynamic scaling unit 110 includes a dynamic scaler engine 201 and a controller unit 202.

The FIG. 2 embodiment shows signal 223, the incoming LLR terms (e.g., "LLRs"), being received by the dynamic scaler engine 201 on its left side. In the FIG. 2 embodiment, the dynamic scaler engine 201 generates dynamic scaling factors in accordance with parameters that describe the communication channel conditions; (i.e., a SNR characterization parameter (e.g., signal 221) and a MCS selection parameter (e.g., signal 222), as shown). These parameters are also provided to the controller unit 202 which controls the operation of the dynamic scaler engine 201. For example, the controller unit 202 can control the frequency at which the dynamic scaling factors are updated, the frequency at which the SNR characterization parameter and MCS selection parameter are sampled, initialization of the dynamic scaler engine 201, and the like. The dynamic scaling factor is applied to each of the incoming LLR terms by the dynamic scaler engine 201 to compute the scaled LLR terms (e.g., signal 224) as described above. The operation of the dynamic scaling unit 110 and the LDPC decoder 111 are now described in greater detail.

As described above, a layered belief propagation algorithm is used to decode the scaled LLR terms. Generally, the scaled LLR terms are decoded on a per codeword basis, where a plurality of terms comprise an LDPC codeword that is represented as a parity check matrix (PCM). The PCM has a plurality of elements arranged in multiple rows and columns (e.g., i rows and j columns). The iterative layered belief propagation (LBP) algorithm that is implemented by the LDPC decoder 111 is a variation of the standard belief propagation algorithm and is considered to produce a good tradeoff between a convergence rate and error-correction performance. The iterative LBP algorithm can be described as follows:

Notation:
i: ith row of PCM;
j: jth column of PCM;

$h_{i,j}$: the ith row, jth column element of PCM;
$v_j$: the jth bit's LLR information obtained from demodulation block, $L_1.0$ bits is assumed to represent it;
$v_{i,j}$: LLR transferred from ith variable node to jth check node, $L_2.0$ bits is assumed to represent it;
$c_{i,j}$: LLR sent from jth check node to ith variable node, $L_3.0$ bits is assumed to represent it;
x.y bits signed fixed point number: This notation used to describe bit widths of the $v_j$, $v_{i,j}$ and $c_{i,j}$ above where x represents the number of integer bits, y represents the number of fractional bits.
1. initialization:

$$c_{i,j} = 0 \text{ for } \forall i,j : h_{i,j} = 1;$$

Iteration number k=1;
2. computation:

$$v_{i,j} = v_j + \sum_{i' \in V(j) \backslash i} c_{i',j} \text{ for } \forall i, j : h_{i,j} = 1 \quad (1)$$

Where V(j) is the set of jth column of PCM with $h_{i,j}=1$;

$$c_{i,j} = \prod_{j' \in C(i) \backslash j} \text{sign}(v_{i,j'}) * \max\left(\min_{j' \in C(i) \backslash j} |v_{i,j'}| - \delta, 0\right) \quad (2)$$

for $\forall i, j : h_{i,j} = 1$

Where C(i) is the set of ith row of PCM with $h_{i,j}=1$, δ is a correction offset factor. Actually, (2) is an approximation of the equation:

$$c_{i,j} = \prod_{j' \in C(i) \backslash j} \text{sign}(v_{i,j'}) * \Psi\left[\sum_{j' \in C(i) \backslash j} \Psi(v_{i,j'})\right] \text{ for } \forall i, j : h_{i,j} = 1$$

With the operator $$\Psi(x) = -\log\left[\tanh\left(\frac{|x|}{2}\right)\right].$$

3. hard decision and parity check:
Hard decision is based on $$v_{j,app} = v_j + \sum_{i \in V(j)} c_{i,j} \text{ for } \forall i, j : h_{i,j} = 1,$$

where $v_{j,app}$ is the a posteriori probability (APP) information on the jth coded bit.
Parity check is to verify HC=0, where H is the PCM, C is the decoded information bits.
4. update iteration number: k=k+1
If parity check is not satisfied and k is less than the maximum iteration number, then repeat step 2 and 3, else the decoding finished. (Note: for some implementations, an iteration may not complete until the parity check is successful or decoding cycle time is used up.)
The dynamic scaling unit 110 takes advantage of the fact that selection of correction offset factor δ used in equation (2) greatly affects the performance of the iterative layered belief propagation algorithm as executed by the LDPC decoder 111. Embodiments of the present invention take advantage of the fact that the optimal δ value is closely related to the communications channel model, SNR parameter and MCS parameter assumed. The dynamic scaler engine 201 may dynamically adjust the correction offset factor δ in accordance with changes in these parameters (e.g., signals 221 and 222).

It should be noted that the correction offset factor δ is applied to the non-scaled LLR terms in order to make the adjustment a priori, prior to the use of the resulting scaled LLR terms by the LDPC decoder 111.

The correction offset factor δ may have a fixed point format represented as 0.y. Ordinarily, this would mean an additional y bits would be needed. The additional y bits would consequently increase the hardware cost and complexity. This problem may be avoided due to the fact that a dynamic scaling factor (DSF) may be applied to the non-scaled LLRs a priori, to produce the resulting scaled LLRs for use by the LDPC decoder 111.

For example, after operation of the FFT unit 103, the per bin system model is defined as:

$$r_{bin} = H_{bin} s + n \quad (3)$$

Where $r_{bin}$ is the per bin vector with the dimensional Nrx (number of receiver antenna), $H_{bin}$ is the MIMO channel with size Nrx by Nss (number of spatial stream), s is the transmitted symbols (OFDM symbols) and n is the additive white Gaussian noise (AWGN).

$H_{bin}$ can be rewritten in column vector form as $$H_{bin} = [h_{bin,1}, \ldots h_{bin,Nss}] \quad (4)$$

For each effective bin we define the bin power as the norm of each $H_{bin}$'s column vector, i.e. $\text{power}_{bin} = (\text{norm}(h_{bin,Nss}))^2$.
The dynamical scaling of LLR procedure is as follow:
1. Find the $$\text{power\_spread} = \max(\text{power}_{bin}) / \min(\text{power}_{bin}) \quad (5)$$

2. if power_spread>$\text{threshold}_{pow\_spr}$
then look up the table to determine the dynamic scaling_factor (DSF).
else DSF equals to 1.
3. Multiply the LLR with scaling_factor and saturate them.
The LLR may be represented by a fixed number of bits. When the LLR is multiplied by the scaling_factor, those bit fields may overflow, or the sign of the LLR may change unintentionally. The saturation indicated in step 3 above checks the value of the LLR after the multiplication to make sure that the result does not overflow the available bit fields and does not unintentionally change sign.

Thus, the scaling factor can be considered to be generated in accordance with a power spread value of a plurality of FFT (Fast Fourier Transform) bins of a per bin system model for OFDM reception.

It should be noted that the power spread defined in equation (5) can be of other formats, as long as it represent a measure of the characteristic of the LDPC decoder input. For example, it can $$\frac{\max \sqrt{powerbin}}{\min \sqrt{powerbin}}.$$

Another example is max(LLR input)/min(LLR input). From an implementation point of view, the choice depends on the convenience of those measures. From the iterative LBP algorithm's point of view, the threshold will be tuned based on the chosen measure.

We can rewrite the iterative LBP algorithm as:
1. initialization:

$$c_{i,j}=0 \text{ for } \forall i,j : h_{i,j}=1;$$

Find the optimal DSF where $v_j$=saturation($v_j$*SF);
Iteration number k=1;
2. computation:

$$v_{i,j} = v_j + \sum_{i' \in V(j)\setminus i} c_{i',j} \text{ for } \forall i, j:h_{i,j} = 1 \qquad (6)$$

Where V(j) is the set of jth column of PCM with $h_{i,j}=1$;

$$c_{i,j} = \prod_{j' \in C(i)\setminus j} \text{sign}(v_{i,j'}) * \max\left(\min_{j' \in C(i)\setminus j} |v_{i,j'}| - \delta, 0\right) \qquad (7)$$

for $\forall i, j:h_{i,j} = 1$

Where C(i) is the set of ith row of PCM with $h_{i,j}=1$, δ is the correction offset factor and is always kept as 1, Actually, equation (7) is an approximation of the equation:

$$c_{i,j} = \prod_{j' \in C(i)\setminus j} \text{sign}(v_{i,j'}) * \Psi\left[\sum_{j' \in C(i)\setminus j} \Psi(v_{i,j'})\right] \text{ for } \forall i, j:h_{i,j} = 1$$

With the operator $$\Psi(x) = -\log\left[\tanh\left(\frac{|x|}{2}\right)\right].$$

3. hard decision and parity check:
Hard decision is based on $$v_{j,app} = v_j + \sum_{i \in V(j)} c_{i,j} \text{ for } \forall i, j:h_{i,j} = 1$$

where $v_{j,app}$ is the APP information of the jth coded bit.
Parity check is to verify HC=0, where H is the PCM, C is the decoded information bits.
4. update iteration number: k=k+1
If parity check is not satisfied and k is less than the maximum iteration number, then repeat step 2 and 3, else the decoding finished. (Note: for some implementations, the iteration may not complete until the parity check is successful or decoding cycle time is used up.)

The scaling of the jth bit's LLR information $v_j$ by scaling factor SF performed during initialization step 1 allows the value for δ to be set to one. This may advantageously reduce the number of bits required to represent not only δ, but also the other variables used in the computation shown in equation (7).

Figure 3:
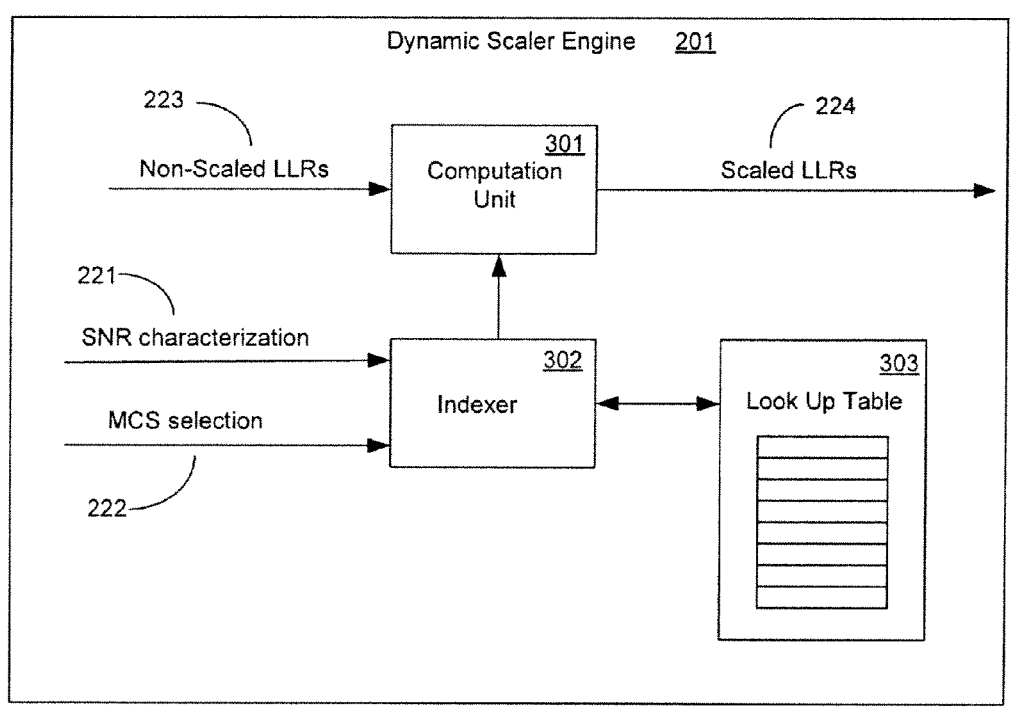
FIG. 3 shows internal components of the dynamic scaler engine in accordance with one embodiment of the present invention.

FIG. 3 shows internal components of the dynamic scaler engine 201 in accordance with one embodiment of the present invention. As depicted in FIG. 3, the dynamic scaler engine 201 includes a computation unit 301, an indexer 302, and a lookup table 303.

The FIG. 3 embodiment shows the manner in which the dynamic scaler engine 110 generates dynamic scaling factors for processing by the computation unit 301. As depicted in FIG. 3, the indexer unit 302 may index a lookup table 303 using both the SNR parameter 221 and the MCS parameter 222. The desired dynamic scaling factor may then be retrieved from the lookup table 303. In some embodiments, the indexer unit 302 may use only a single parameter (i.e., only the SNF parameter 221) to index the lookup table 303.

As described above, the dynamical scaling of LLR procedure is defined as:
1. Find the $$\text{power\_spread} = \max(\text{power}_{bin})/\min(\text{power}_{bin}) \qquad (5)$$

if power_spread>threshold$_{pow\_spr}$
then use the look up table 303 to determine the dynamic scaling factor.
else the dynamic scaling factor equals 1.
2. Multiply the LLR with dynamic scaling factor and saturate them.

Table 1 shows an example of one embodiment of the lookup table 303. In this embodiment, the table is a function of a single parameter, the MCS parameter, as opposed to being a function of two or more parameters, for example, the SNR parameter and the MCS parameter.

TABLE 1

| An example of a table used for scaling factor selection | | | | | | | | |
|---|---|---|---|---|---|---|---|---|
| MCS | 8 | 9 | 10 | 11 | 12 | 13 | 14 | 15 |
| SF | 2 | 2 | 2 | 2 | 3 | 3 | 3 | 3 |

Figure 4:
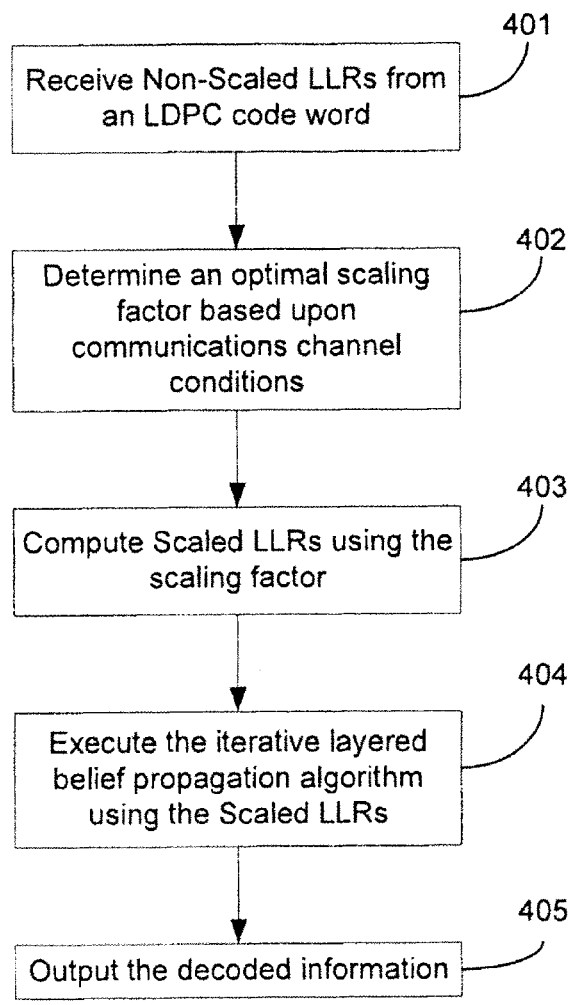
FIG. 4 shows a flowchart of the steps of a process for decoding an LDPC codeword in accordance with one embodiment of the present invention.

FIG. 4 shows a flowchart of the steps of a process 400 for decoding an LDPC codeword in accordance with one embodiment of the present invention. As depicted in FIG. 4, process 400 is described in the context of the receiver 100, and describes the general steps involved in the receiver 100 receiving LDPC encoded information and performing the decoding of that information.

Process 400 begins in step 401, where non-scaled LLR terms are received by a dynamic scaling unit 110. As described above, the non-scaled LLR terms are produced by the demodulation unit 104. In step 402, the dynamic scaling unit 110 determines an optimal dynamic scaling factor based upon communications channel conditions for the receiver 100. As described above, the dynamic scaling unit 110 includes a dynamic scaling engine 201 that receives parameters describing the communication channel conditions. In one embodiment, these parameters are the SNR (signal-to-noise ratio) parameter 221 and the MCS (modulation coding scheme) parameter 222. Using these parameters, the indexer 302 within the dynamic scaling engine 201 accesses the lookup table 303 and retrieves the dynamic scaling factor.

In step 403, the scaled LLR terms are computed using the dynamic scaling factor. As described above, within the dynamic scaler engine 201, the computation unit 301 applies the dynamic scaling factor to each of the non-scaled LLR terms (e.g., signal 223), thus generating the scaled LLR terms (e.g., signal 224). In step 404, the scaled LLR terms are received by the LDPC decoder unit 111, where they are used as an input for the iterative layered belief propagation algorithm. As described above, the iterative LBP algorithm implemented by the LDPC decoder 111 is a variation of the standard belief propagation algorithm and is tuned to attain a good tradeoff between a convergence rate and error-correction performance. Subsequently, in step 405, the resulting decoded information is then output from the receiver 100.

Partial Parity Check Embodiments of the Invention:

Embodiments of the present invention that increase performance by performing partial parity checks are now described. Further, embodiments of the present invention provide programmable control of the number of iterations performed and thereby allow the decoding process to be customized, to be performance centric, to be power centric, or some combination thereof.

Figure 5:
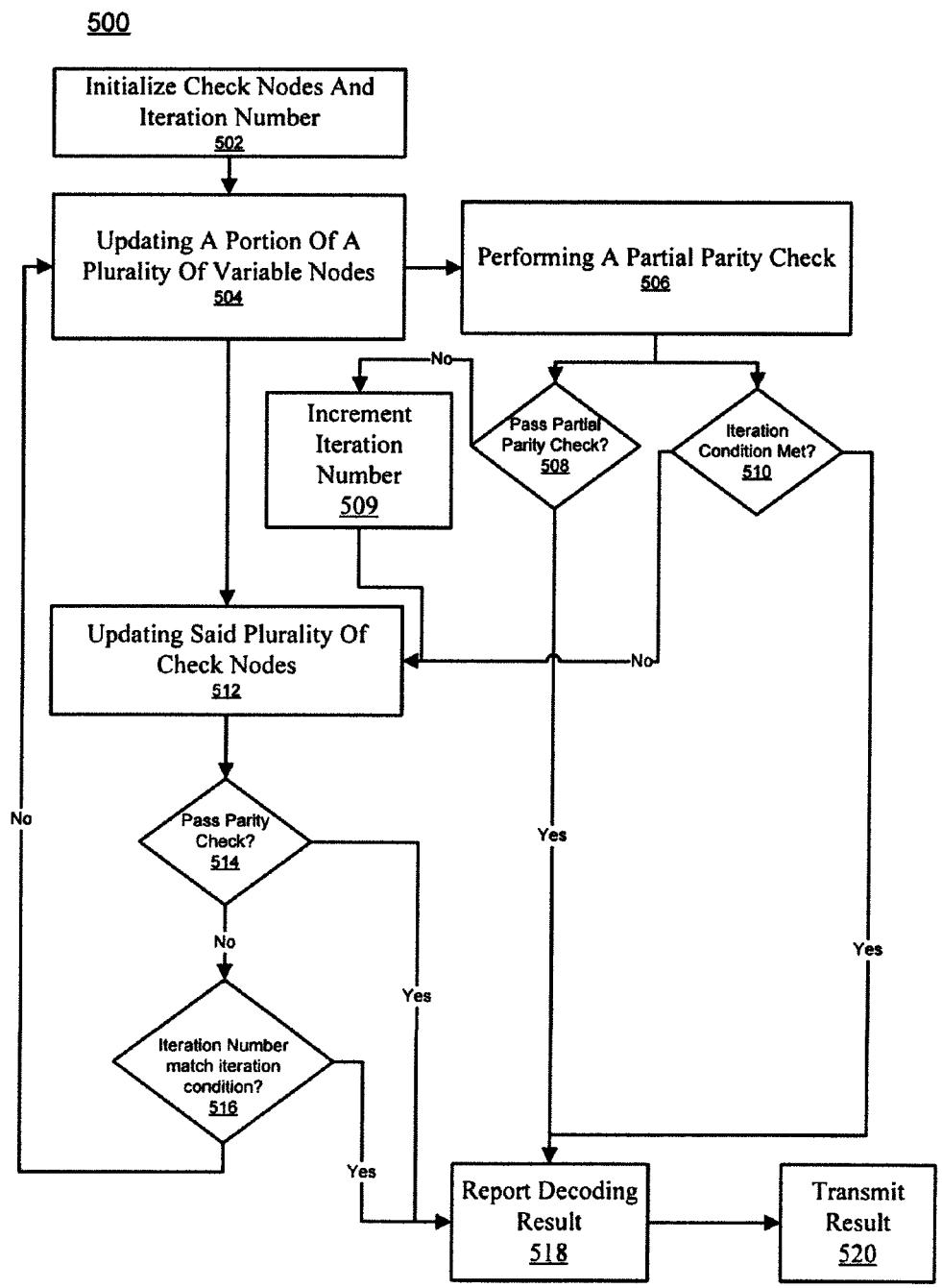
FIG. 5 shows a flowchart of an exemplary decoding process in accordance with one embodiment of the present invention.
Figure 6:
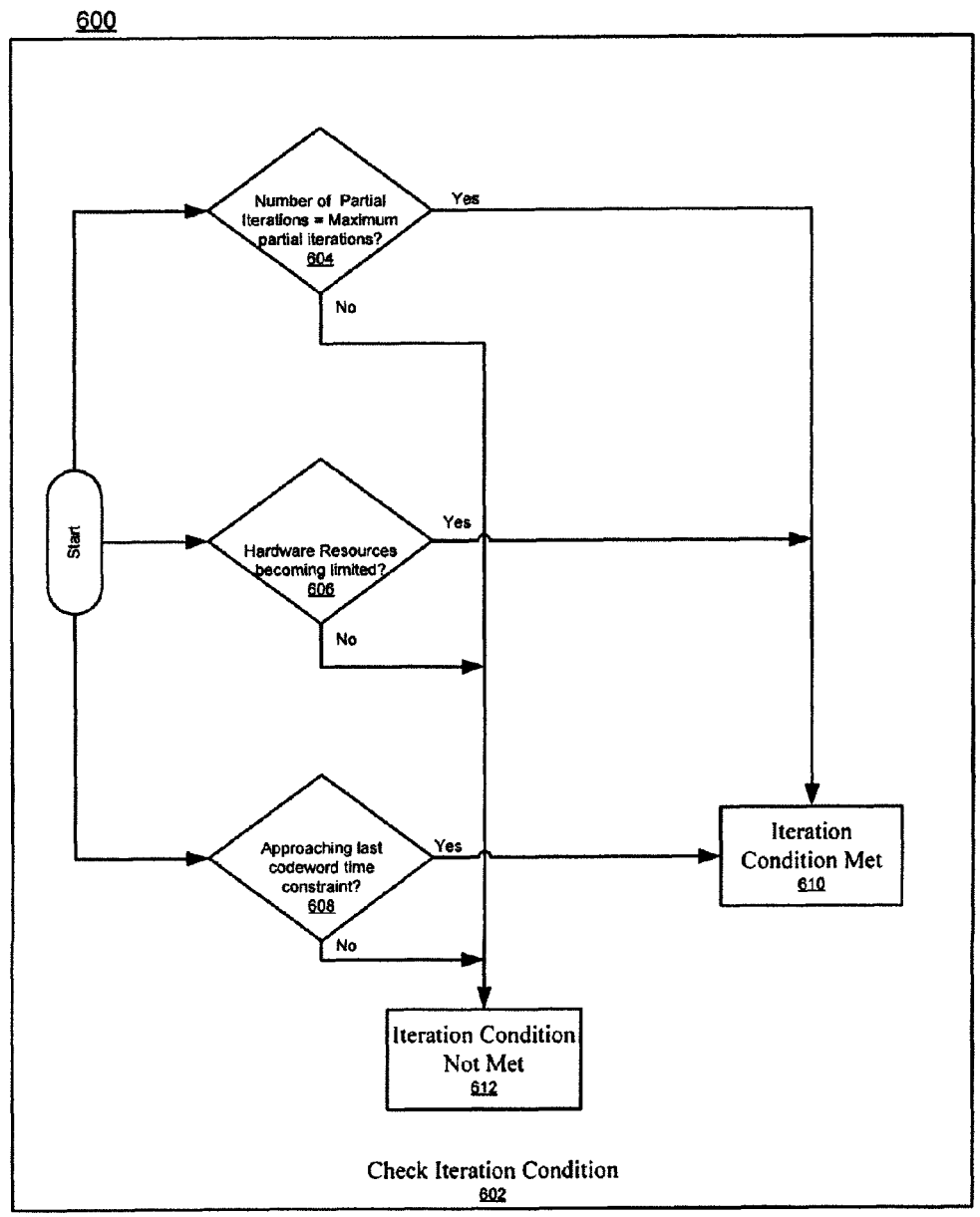
FIG. 6 shows a flowchart based on iteration conditions in accordance with one embodiment of the present invention.

The following discussion sets forth in detail the operations of the present technology for decoding a low-density parity-check code (LDPC) codeword. With reference to FIGS. 5 and 6, flowcharts 500 and 600 each illustrate example blocks used by various embodiments of the present technology. Flowcharts 500 and 600 include processes that, in various embodiments, are carried out by a processor under the control of computer-readable and computer-executable instructions. Embodiments of the present invention may thus be stored as computer readable media or computer-executable instructions including, but not limited to, a firmware update, software update package, or hardware (e.g., ROM).

FIG. 5 shows a flowchart of an exemplary decoding process in accordance with one embodiment of the present invention. The blocks of flowchart 500 may be executed or carried out by a LDPC decoder (e.g., LDPC decoder 111) as part of an iterative layered belief propagation (LBP) algorithm. It is appreciated that flowchart 500 may be carried out by a communication device operable to communicate via a variety of protocols, formats, or standards including, but not limited to wireless, orthogonal frequency-division multiplexing (OFDM), 802.11n, 10GBase-T Ethernet (802.3an), WiMAX (IEEE 802.16e), DVB-S2 (Digital video broadcasting). It is further appreciated that embodiments may be operable to be used with a number of different iterative decoding processes.

At block 502, a plurality of check nodes and an iteration number (e.g., partial iteration number) are initialized. For example, all the check nodes may be initialized to zero and the iteration number to one. At block 504, a portion of a plurality of variable nodes are updated.

At block 506, a partial parity check based on the updated portion of the plurality of variable nodes is performed. For example, a partial parity check may be performed on a row, or multiple rows, of a parity check matrix (PCM) related to the updated variable nodes.

Advantageously, instead of a conventional LBP algorithm where the parity check does not begin until all the variable nodes are updated (e.g., the whole PCM matrix), the partial parity checks may be performed prior to the updating of all of the variable nodes. Accordingly, embodiments of the present invention are able to make use of partial updates of the variable nodes. Partial iterations thus facilitate the correction of a bit earlier than conventional method, thereby resulting in increased performance.

In one exemplary embodiment, the partial parity checks may be run in parallel with the update of variable nodes (e.g., block 504 or once some of the variable notes are updated, a partial parity check may be performed). It is appreciated that embodiments of the present invention take advantage of the fact that the larger the number iterations, the better the performance, until the number of iterations reaches a point where the performance gain diminishes. It is further appreciated that embodiments of the present invention may thus avoid performing iterations that provide minimal or little improvement in performance.

At block 508, a determination is made as to whether to report a decoding result based on a result of a partial parity check. If the partial parity check passes and the correct bits have been determined, block 518 may be performed. If the partial parity check has not passed or the correct bits have not been determined, the decoding process continues at block 509. At block 509, an iteration number is incremented and block 512 may then be executed.

At block 510, a determination is made as to whether to report a decoding result based on an iteration condition being met. Iteration conditions may include a variety of factors or values to control the number of iterations, further described herein, including, but not limited to, hardware resources (e.g., buffer usage or level), maximum number of iterations (e.g., iterations or partial iterations), and whether a codeword is the last codeword of a data frame. At block 512, the plurality of check nodes are updated.

At block 514, based on a parity check, whether to report a decoding result is determined. The decoding result may be based on a posteriori probability (APP) information for a coded bit. The parity check may be to verify that a parity check matrix (PCM) and decoded information bits come out to zero (e.g., the bits are correct). If the parity check passes, block 518 may be performed. If the parity check does not pass, block 516 may be performed.

At block 516, based on a determining whether an iteration number matches an iteration condition, a determination as to whether to report a decoding result is made. In one embodiment, the iteration number may be a partial iteration number or count. Thus if complete iterations are desired, the partial iteration number may be compared to see if the partial iteration number is an integer multiple of the number of rows of the PCM. If the iteration number matches an iteration condition (e.g., the iteration number matches the maximum number of iterations), block 518 may be performed. If the iteration number does not match an iteration condition (e.g., the iteration number is less than the maximum number of iterations), block 515 may be performed. At block 515, an iteration number or value is incremented. Value of a programmable register or maximum iterations may be based on simulations.

At block 518, a decoding result is reported. The decoding result may be based on a partial parity check result (e.g., the correct bits were received or the parity check of the whole matrix). The decoding result may be from decoding a variety of transmissions including, but not limited to, an OFDM transmission or an 802.11n transmission.

If the codeword being processed is the last codeword of a data frame block 520 may be executed. At block 520, a result is transmitted. The result transmitted may include acknowledging (ACK) receiving of a data frame, packet, or other data unit, etc.

FIG. 6 shows a flowchart based on iteration conditions in accordance with one embodiment of the present invention. Flowchart 600 shows an exemplary process for testing iteration conditions. The blocks of flowchart 600 facilitate control of the number of iterations (e.g., partial or complete iterations) and thereby deliver increased performance and power savings. It is appreciated that iteration conditions may be tested in parallel and that multiple iteration conditions may be used to control the number of iterations.

At block 604, a number of partial iterations is compared against a maximum number of partial iterations. The maximum number of partial iterations may be stored in a programmable register with a dynamic or fixed value (e.g., based on simulations). The maximum number of partial iterations facilitates power savings, performance increases, and avoids iterations with marginal benefit. For example, a dynamic number of partial iterations may be performed for each codeword to tailor the iteration count as needed.

If the number of partial iterations is not equal to the maximum number of partial iterations, block 612 may be performed. If the number of partial iterations is equal to the maximum number of iterations, block 610 may be performed.

At block 606, a check is made as to whether hardware resources are becoming limited. As data is being processed, additional bits of data may be received in a stream. These additional bits require additional hardware resources and thus hardware resources need to be available for the continued receiving of the data stream. Accordingly, hardware resources (e.g., buffer level) may be monitored and the number of iterations controlled based on the availability of hardware resources. For example, a buffer monitor register may be used to determine if the buffer level is approaching full.

The monitoring of hardware resources allows the number of partial or complete iterations to be optimized according to transmission conditions. In one embodiment, the iteration pipeline may be allowed to run (e.g., partial iterations) until the next codeword is coming in and competing for hardware resources. For example, when the input buffer is getting full, the current iteration count may be set to the maximum number of partial iterations. Thus, the number of iterations can be dynamically optimized from codeword to codeword.

Embodiments further overcome transmission protocol variations (e.g., 802.11n) resulting in may have different code lengths, modulation coding schemes (MCS), shortening, puncturing schemes, which results varies the available decoding time based on different combinations.

Basing iteration conditions on hardware resources further allows adapting the number of partial iterations to the time corresponding to receiving data frames. Code words may not necessarily be aligned with OFDM symbols (e.g., a codeword could span two or more OFDM symbols) and thus code words may not occupy the same amount of time. For example, an OFDM symbol may be 4 μs with 75 bits capacity while a codeword is 110 bits and thus each codeword may not occupy the same amount of absolute time as code words are divided up differently over each OFDM symbol.

Further, data rates and bandwidth may vary so that every OFDM symbol can include dramatically different number of bits of information. For example, at low data rate at 20 MHz bandwidth for the same amount of codeword may be spread across many OFDM symbol, may result in a good amount of time before hardware resources become limited and thus quite a few iterations (e.g., 30 iterations) may be run. As another example, with 40 Mhz of bandwidth at a high data rate, a codeword could be even less than one OFDM symbol and thereby only be able to run 6 or 7 iterations.

If hardware resources are not becoming limited (e.g., additional iterations may be performed before hardware resources are limited), block 612 may be performed. If hardware resources are becoming limited (e.g., there is not enough time to perform additional iterations before hardware resources are limited), block 610 may be performed.

At block 608, a check is made if a last codeword time constraint is approaching. Once the last codeword has been received, there is a fixed amount of time to finish the decoding and determine whether the packet or portion thereof was received successfully. The last codeword time constraint may be based on a variety of factors including, but not limited to, a short interframe space (SIFS) or a power amplifier (PA) activation time. For example, for the last codeword of an IEEE 802.11 transmission, the SIFS requirement sets an upper limit on the time to respond and therefore a limit on the number of iterations. It is appreciated that variations in system designs (e.g., SIFS and PA activation time, etc.) may result in the last codeword time constraint for decoding varying from system to system. The last codeword time constraint may be set through programmable registers whose values can be pre-computed. For example, based on the MCS, different code lengths, shortening, puncturing schemes, etc. the maximum number of iterations may be determined.

If the last codeword time constraint is approaching (e.g., additional partial iterations can not be performed before the last codeword time constraint is exceeded), block 610 may be performed. If the last codeword time constraint is not approaching, block 612 may be performed.

At block 610, an iteration condition has been met and decoding process may proceed accordingly (e.g., perform block 518). At block 612, iteration condition has not been met and the decoding process may proceed accordingly (e.g., perform block 512).

Figure 7:
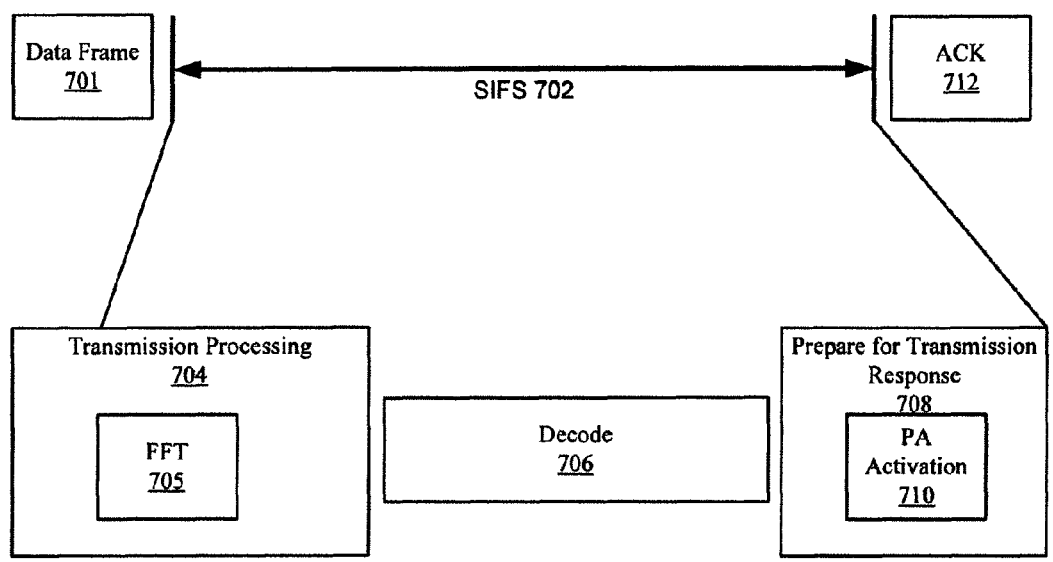
FIG. 7 shows a block diagram of exemplary time diagram based on an iteration condition in accordance with one embodiment of the present invention.

FIG. 7 shows a block diagram of exemplary time diagram based on an iteration condition in accordance with one embodiment of the present invention. It is appreciated that additional or less events, transmissions, etc. may be part of the communications illustrated by exemplary time diagram 700. Time diagram 700 illustrates the last codeword time constraint.

Data frame 701 corresponds to a packet of data which may include among other things, an LDPC codeword and associated parity check matrix (PCM). SIFS 702 corresponds to the time between data frame and its acknowledgment (ACK) 712.

Transmission processing block 708 corresponds to processing of the transmission occurring as the remaining portions of the transmission are received. In one embodiment, Fast Fourier Transform 710 is performed on the received transmission. It is appreciated that transmission processing block 708 may include other operations including, but not limited to, buffering and interleaving.

Decode block 706 corresponds to the processing of transmission data. It is appreciated that the length of time corresponding to block 704 and block 708 may restrict or reduce the time for decoding as represented by decode block 706. Accordingly, embodiments of the present invention may control the number of iterations thereby providing real time response (e.g., decoding results) within SIFS 702 time period.

Prepare for transmission response block 708 corresponds to the time for making preparations for a response transmission. In one embodiment, the preparations include power amplifier activation time 710. At block 712, an acknowledgement is sent.

Figure 8:
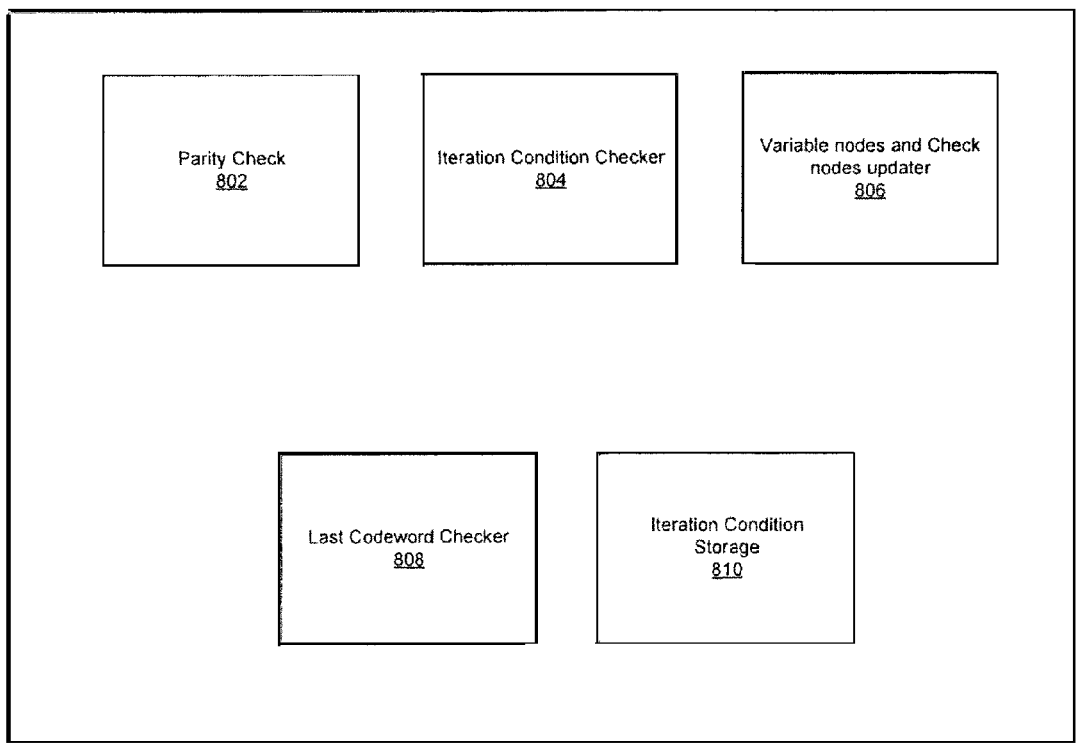
FIG. 8 shows a block diagram of an exemplary decoding system in accordance with one embodiment of the present invention.

The following discussion sets forth details of the present technology systems for decoding a low-density parity-check (LDPC) codeword. FIG. 8 illustrates example components used by various embodiments of the present technology. System 800 includes components or modules that, in various embodiments, are carried out by, for example, an embedded processor under the control of computer-readable and computer-executable instructions. The computer-readable and computer-executable instructions reside, for example, in data storage features such as computer usable memory, removable storage, and/or non-removable storage. The computer-readable and computer-executable instructions are used to control or operate in conjunction with, for example, a processing unit of an embedded computer system. It should be appreciated that the aforementioned components of system 800 can be implemented in hardware or software or in a combination of both. Although specific components are disclosed in system 800 such components are examples. That is, embodiments are well suited to having various other components or variations of the components recited in system 800. It is appreciated that the components in system 800 may operate with other components than those presented, and that not all of the components of system 800 may be required to achieve the goals of system 800.

FIG. 5 shows a block diagram of an exemplary decoding system in accordance with one embodiment of the present invention. System 800 may carry out decoding of LDPC codewords (e.g., flowcharts 500 and 600). System 800 includes parity check module 802, iteration condition checker 804, variable nodes and check nodes updated 806, last codeword checker 808, and iteration condition storage 810.

Parity check module 802 may perform partial parity checks based on updates to a portion of variable nodes. As described herein, the partial parity checks facilitate power savings by performing parity checks on each row or multiple rows as the rows are updated. The partial parity checks allow decoding results to be reported based on a maximum number of partial iterations thereby allowing processing to be controlled. It is appreciated that parity check module 802 may also perform complete parity checks.

Iteration condition checker 804 determines whether iteration conditions have been met. As described herein, iteration conditions can include, but are not limited to, passing parity checks (e.g. partial or complete parity checks), hardware resource availability (e.g., a buffer full percentage), and a latency (e.g., time constraint) to decode a last codeword. The iterations conditions can be used to determine a maximum number of iterations and thereby conserve power by tailoring the number of iterations. Iteration conditions may be stored, accessed, and set by iteration condition storage 810.

Variable nodes and check nodes updater 806 performs updates of the variable and the check nodes. In one embodiment, the updates of the variable and check nodes may be part of an iterative layered belief propagation (LBP) algorithm.

Last codeword checker 808 determines whether a codeword being received is the last codeword of a transmission. For example, last codeword checker 810 may determine whether a codeword is a last codeword of a data frame and correspondingly set a maximum number of iterations or a time constraint (e.g., latency to decode a last codeword).

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

The invention claimed is:

1. A method of decoding a low-density parity-check (LDPC) codeword, the method comprising:
performing a partial parity check;
based on the partial parity check, determining whether an iteration condition is met, wherein determining whether the iteration condition is met includes determining whether a time to decode a last codeword is approaching;
when the iteration condition is met, reporting a decoding result; and
when the iteration condition is not met, updating a plurality of check nodes and performing a parity check.

2. The method of claim 1, wherein determining whether the iteration condition is met includes determining whether a number of partial iterations is equal to a maximum number of iterations.

3. The method of claim 2, further including storing the maximum number of iterations as a dynamic value.

4. The method of claim 2, further including performing a simulation, and storing a result of the simulation as the maximum number of iterations.

5. The method of claim 1, wherein determining whether the iteration condition is met includes determining whether hardware resources are limited.

6. The method of claim 5, wherein determining whether hardware resources are limited includes monitoring a buffer level and indicating the hardware resources are limited when the buffer level is approaching full.

7. The method of claim 1, wherein determining whether the time to decode the last codeword is approaching is based on a short interframe space (SIFS).

8. The method of claim 1, wherein determining whether the time to decode the last codeword is approaching is based on a power amplifier activation time.

9. The method of claim 1, wherein reporting the decoding result includes decoding of an OFDM transmission.

10. A system for decoding a low-density parity-check (LDPC) codeword, the system comprising:
a partial parity check module configured to perform a partial parity check based on updates to a portion of variable nodes;
an iteration condition checker coupled to the partial parity check module and configured to determine whether an iteration condition of a plurality of iteration conditions has been met, wherein the iteration condition checker is configured based on a latency to decode a last codeword; and
an iteration condition storage module configured to store at least one iteration condition.

11. The system of claim 10, further comprising:
a last code word checker configured to determine whether a codeword being received is a last codeword of a transmission, the last code word checker coupled to the iteration condition checker.

12. The system of claim 10, wherein the iteration condition checker is configured to monitor a buffer usage level.

13. The system of claim 10, wherein the iteration condition checker is configured to check results of the partial parity check module.

14. The system of claim 10, wherein the iteration condition checker is configured to report a decoding result based on a maximum number of partial iterations being performed, the maximum number of partial iterations being stored as the at least one iteration condition.

15. A system for decoding a low-density parity-check (LDPC) codeword, the system comprising:
a partial parity check module configured to perform a partial parity check based on updates to a portion of variable nodes;
an iteration condition checker coupled to the partial parity check module, wherein the iteration condition checker is configured to determine whether an iteration condition of a plurality of iteration conditions has been met, and to report a decoding result based on a maximum number of partial iterations being performed, the maximum number of partial iterations being based on a latency to decode a last codeword; and
an iteration condition storage module configured to store at least one iteration condition.

16. A computer-readable, non-transitory media comprising instructions therein that, when executed by a processor, implement a method of decoding a low-density parity check (LDPC) codeword, the method comprising:

performing a partial parity check;

based on the partial parity check, determining whether an iteration condition is met, wherein determining whether the iteration condition is met includes determining whether a time to decode a last codeword is approaching;

when the iteration condition is met, reporting a decoding result; and when the iteration condition is not met, updating a plurality of check nodes and performing a parity check.

17. The computer-readable media of claim 16, wherein the computer-readable media comprises a firmware update.

18. A computer-readable media of claim 16, wherein the decoding result is a decoding of an 802.11n transmission.

* * * * *